United States Patent
Kawaguchi et al.

(10) Patent No.: US 9,586,854 B2
(45) Date of Patent: Mar. 7, 2017

(54) ALKALI-FREE GLASS

(71) Applicant: Nippon Electric Glass Co., Ltd., Shiga (JP)

(72) Inventors: Takahiro Kawaguchi, Shiga (JP); Shinkichi Miwa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 14/368,584

(22) PCT Filed: Dec. 25, 2012

(86) PCT No.: PCT/JP2012/083448
§ 371 (c)(1),
(2) Date: Jun. 25, 2014

(87) PCT Pub. No.: WO2013/099855
PCT Pub. Date: Jul. 4, 2013

(65) Prior Publication Data
US 2014/0377525 A1  Dec. 25, 2014

(30) Foreign Application Priority Data
Dec. 29, 2011 (JP) .................. 2011-290260

(51) Int. Cl.
*C03C 3/091* (2006.01)
*C03C 3/093* (2006.01)
*H01L 51/00* (2006.01)

(52) U.S. Cl.
CPC ............ *C03C 3/091* (2013.01); *C03C 3/093* (2013.01); *H01L 51/0096* (2013.01)

(58) Field of Classification Search
CPC .......... C03C 3/087; C03C 3/091; C03C 3/093
See application file for complete search history.

(56) References Cited

U.S. PATENT DOCUMENTS

| | | | |
|---|---|---|---|
| 5,801,109 A | 9/1998 | Nishizawa et al. | |
| 5,811,361 A | 9/1998 | Miwa | |
| 6,169,047 B1 | 1/2001 | Nishizawa et al. | |
| 6,465,381 B1 | 10/2002 | Lautenschlager et al. | |

(Continued)

FOREIGN PATENT DOCUMENTS

| | | |
|---|---|---|
| CN | 1303828 | 7/2001 |
| JP | 9-169538 | 6/1997 |

(Continued)

OTHER PUBLICATIONS

Machine Translation of JP 2000-044278, Feb. 15, 2000.*

(Continued)

*Primary Examiner* — Elizabeth A Bolden
(74) *Attorney, Agent, or Firm* — Wenderoth, Lind & Ponack, L.L.P.

(57) ABSTRACT

Provided is an alkali-free glass, including as a glass composition, in terms of mol %, 60 to 70% of $SiO_2$, 9.5 to 17% of $Al_2O_3$, 0 to 9% of $B_2O_3$, 0 to 8% of MgO, 2 to 15% of CaO, 0.1 to 10% of SrO, and 0.5 to 4% of BaO, having a molar ratio $(CaO+SrO+BaO)/Al_2O_3$ of 0.6 to 1.0, and being substantially free of alkali metal oxides.

18 Claims, 2 Drawing Sheets

(56) References Cited

U.S. PATENT DOCUMENTS

| | | | |
|---|---|---|---|
| 7,833,919 B2 * | 11/2010 | Danielson | C03C 3/091 |
| | | | 501/64 |
| 2002/0013210 A1 | 1/2002 | Peuchert et al. | |
| 2002/0183188 A1 | 12/2002 | Peuchert | |
| 2007/0190340 A1 * | 8/2007 | Coppola et al. | 428/432 |
| 2007/0191207 A1 | 8/2007 | Danielson et al. | |
| 2008/0110208 A1 | 5/2008 | Ellison | |
| 2009/0133441 A1 | 5/2009 | Ellison | |
| 2009/0294773 A1 | 12/2009 | Ellison | |
| 2010/0197477 A1 | 8/2010 | Ellison | |
| 2011/0048074 A1 | 3/2011 | Danielson et al. | |
| 2012/0088648 A1 | 4/2012 | Ellison et al. | |

FOREIGN PATENT DOCUMENTS

| | | |
|---|---|---|
| JP | 9-169539 | 6/1997 |
| JP | 10-72237 | 3/1998 |
| JP | 2987523 | 12/1999 |
| JP | 2990379 | 12/1999 |
| JP | 2000-044278 | 2/2000 |
| JP | 2001-048573 | 2/2001 |
| JP | 2002-29775 | 1/2002 |
| JP | 2006-213595 | 8/2006 |
| JP | 2009-525942 | 7/2009 |
| JP | 2009-286689 | 12/2009 |
| JP | 4445176 | 1/2010 |
| JP | 2010-509180 | 3/2010 |
| JP | 4534282 | 6/2010 |
| JP | 2012-82130 | 4/2012 |
| WO | 01/00538 | 1/2001 |

OTHER PUBLICATIONS

Notification of Transmittal of Translation of the International Preliminary Report on Patentability (Chapter I or Chapter II), issued Jul. 10, 2014 in corresponding International Application No. PCT/JP2012/083448.

International Preliminary Report on Patentability issued Jul. 1, 2014 in corresponding International Application No. PCT/JP2012/083448.

English translation of Written Opinion of the International Searching Authority issued Mar. 26, 2013 in corresponding International Application No. PCT/JP2012/083448.

International Search Report issued Mar. 26, 2013 in International (PCT) Application No. PCT/JP2012/083448.

Chinese Office Action dated Aug. 27, 2015. issued in corresponding Chinese Patent Application No. 201280064559.X. (with English Translation).

Chinese Office Action dated Sep. 26, 2016, issued in counterpart Chinese Patent Application No. 201280064559.X (with English translation).

Zhao et al., "Glass Technology", Chemical Industry Press, Sep. 30, 2006, pp. 100-101.

* cited by examiner

ALKALI-FREE GLASS

TECHNICAL FIELD

The present invention relates to alkali-free glass, and more particularly, to alkali-free glass suitable for a flat panel display (FPD) such as a liquid crystal display (LCD) or an OLED display (OLED).

BACKGROUND ART

In an FPD such as an LCD or an OLED, there is an increasing demand for achievement of high performance of a panel, such as reduction in thickness, reduction in weight, reduction in power consumption, and achievement of high definition.

In a high-performance display, low temperature polysilicon (LTPS) is used frequently as a thin-film transistor (TFT) instead of general-purpose amorphous silicon (a-Si). LTPS has a high carrier mobility, and hence allows an aperture ratio to be larger than the case of using, for example, a-Si, thus being able to manufacture a higher-definition panel. LTPS is also used currently in an OLED, which is expected to be a next-generation FPD.

CITATION LIST

Patent Literature 1: JP 2002-29775 A
Patent Literature 2: JP 2009-286689 A
Patent Literature 3: JP 2009-525942 W
Patent Literature 4: JP 4534282 B2
Patent Literature 5: JP 4445176 B2

SUMMARY OF INVENTION

Technical Problem

A glass substrate is widely used as a substrate for a high-performance display using LTPS. A glass substrate used for this application needs to have the following main characteristics.
(1) To be substantially free of alkali metal oxides in order to prevent alkali ions from diffusing in a semiconductor film formed in a heat treatment process.
(2) To have a low density in order for the display to be reduced in weight.
(3) To have a high strain point (or annealing temperature) in order to reduce the thermal shrinkage of the glass substrate in an LTPS production process.
(4) To be excellent in productivity and be excellent particularly in devitrification resistance and meltability in order to produce the glass substrate at low cost.
(5) To have a high specific Young's modulus ($E/\rho$) in order to suppress failures attributed to the deflection of the glass substrate.

In recent years, FPD price competition has been accelerating because FPDs have been widely used rapidly. When each panel manufacturer produces a plurality of panels, higher productivity needs to be targeted, and hence the manufacturer adopts the step of applying processing on a large glass substrate and then cutting the large glass substrate into pieces having dimensions matching those of a final screen (so-called multiple patterning). When a plurality of panels are produced at one time, the cost per panel reduces. Thus, a demand for a larger glass substrate has become stronger in recent years.

On the other hand, in association with a higher-definition display, a circuit pattern formed on a glass substrate tends to be finer. Thus, surface defects which are caused by minute foreign matter or the like but have not been problems heretofore are gradually causing circuit disconnection and circuit shortage. In order to reduce the cost per panel, a glass substrate that rarely has a defect is required. However, as a glass substrate is larger (or thinner), failures attributed to the glass substrate are more liable to occur.

Further, after a glass substrate is formed, the glass substrate goes through steps such as cutting, annealing, inspecting, and washing steps, during which the glass substrate is placed in a cassette provided with a plurality of shelves in a vertical direction and is transferred. This cassette usually has a structure in which shelves are provided at the right and left inner surfaces and both edges opposed to each other of a glass substrate are placed on the shelves so that the glass substrate can be held in a horizontal direction. However, a large and thin glass substrate has a large deflection amount. Thus, when the glass substrate is placed in the cassette, part of the glass substrate comes into contact with the cassette, resulting in breakage of the glass substrate, or when the glass substrate is transferred, the glass substrate significantly swings and is liable to be unstably held. A cassette having a similar structure is used in electronic device manufacturers as well, with the result that similar failures may occur in the electronic device manufacturers as well as the panel manufactures. Further, when a glass substrate which is mounted in an electronic device is liable to deflect, problems such as a distorted image in the image plane of the electronic device are liable to occur.

Until now, various kinds of alkali-free glass have been proposed as glass substrates for a display.

However, even if any kind of existing alkali-free glass is used as a glass substrate, when the strain point and specific Young's modulus of the glass substrate are increased in order to suppress the thermal shrinkage thereof in an LTPS production process, the following problems may occur. That is, the density of the glass substrate increases, resulting in difficulty in achieving reduction in weight, and hence, when a larger and thinner glass substrate is produced, failures attributed to the deflection of the glass substrate occur. Moreover, the melting temperature increases and the devitrification resistance deteriorates, thus causing, for example, easy formation of defects, with the result that the productivity deteriorates.

In this context, as a larger glass substrate is produced, the probability of the occurrence of defects in the glass substrate is higher. Thus, it is very difficult to produce a large glass substrate that rarely has a defect.

In view of the circumstances described above, a technical object of the present invention is to invent alkali-free glass which is excellent in productivity (in particular, devitrification resistance and meltability) and has a sufficiently high strain point and a sufficiently high specific Young's modulus.

Solution to Problem

The inventors of the present invention have repeatedly performed various experiments. As a result, the inventors have found that the technical object can be achieved by strictly restricting a range of a glass composition of alkali-free glass. Thus, the inventors propose the finding as the present invention. That is, an alkali-free glass of the present invention comprises as a glass composition, in terms of mol %, 60 to 70% of $SiO_2$, 9.5 to 17% of $Al_2O_3$, 0 to 9% of $B_2O_3$, 0 to 8% of MgO, 2 to 15% of CaO, 0.1 to 10% of SrO, and 0.5 to 4% of BaO, has a molar ratio (CaO+SrO+BaO)/Al$_2$O$_3$ of 0.6 to 1.0, and is substantially free of alkali metal oxides. Herein, the phrase "substantially free of alkali metal oxides" refers to a case where a content of alkali metal oxides (Li$_2$O, Na$_2$O, and K$_2$O) in a glass composition is 6,000 ppm (by mass) or less, preferably 2,000 ppm (by mass).

The glass composition range of the alkali-free glass of the present invention is restricted as described above. As a result, the devitrification resistance, meltability, strain point, and specific Young's modulus of the alkali-free glass can be improved sufficiently. Particularly when the molar ratio (CaO+SrO+BaO)/Al$_2$O$_3$ is restricted to 0.6 to 1.0, the devitrification resistance can be improved remarkably.

Second, the alkali-free glass of the present invention preferably has a molar ratio (CaO+SrO+BaO)/Al$_2$O$_3$ of 0.6 to 0.9.

Third, the alkali-free glass of the present invention preferably further comprises 0.001 to 0.3 mol % of SnO$_2$.

Fourth, the alkali-free glass of the present invention is preferably substantially free of As$_2$O$_3$ and Sb$_2$O$_3$. Herein, the phrase "substantially free of As$_2$O$_3$" refers to a case where the content of As$_2$O$_3$ in a glass composition is less than 0.05%. The phrase "substantially free of Sb$_2$O$_3$" refers to a case where the content of Sb$_2$O$_3$ in a glass composition is less than 0.05%.

Fifth, the alkali-free glass of the present invention preferably comprises less than 0.2 mol % of ZrO$_2$.

Sixth, the alkali-free glass of the present invention preferably comprises more than 0.5 mol % of B$_2$O$_3$.

Seventh, the alkali-free glass of the present invention preferably has a molar ratio (SiO$_2$+MgO)/B$_2$O$_3$ of less than 18.5.

Eighth, the alkali-free glass of the present invention preferably has a strain point of more than 670° C. Herein, the term "strain point" refers to a value obtained by measurement based on the method of ASTM C336.

Ninth, the alkali-free glass of the present invention preferably has a Young's modulus of more than 75 GPa. Herein, the term "Young's modulus" refers to a value obtained by measurement using a bending resonance method. Note that 1 GPa is equivalent to about 101.9 Kgf/mm$^2$.

Tenth, the alkali-free glass of the present invention preferably has a specific Young's modulus of more than 30 GPa/g/cm$^3$.

Eleventh, the alkali-free glass of the present invention preferably has a density of less than 2.59 g/cm$^3$. Herein, the term "density" refers to a value obtained by measurement by the Archimedes method.

Twelfth, the alkali-free glass of the present invention preferably has a liquidus temperature of less than 1,210° C. Herein, the "liquidus temperature" may be calculated by measuring a temperature at which crystals of glass are deposited after glass powder that passed through a standard 30-mesh sieve (500 μm) and remained on a 50-mesh sieve (300 μm) is placed in a platinum boat and then kept for 24 hours in a gradient heating furnace.

Thirteenth, the alkali-free glass of the present invention preferably has an average thermal expansion coefficient in the temperature range of 30 to 380° C. of 30×10$^{-7}$ to 50×10$^{-7}$/° C. Herein, the "average thermal expansion coefficient in the temperature range of 30 to 380° C." may be measured with a dilatometer.

Fourteenth, the alkali-free glass of the present invention preferably has a temperature at 10$^{4.0}$ poise of less than 1,350° C. Herein, the "temperature at 10$^{4.0}$ poise" may be measured by a platinum sphere pull up method.

Fifteenth, the alkali-free glass of the present invention preferably has a temperature at 10$^{2.5}$ poise of less than 1,620° C. Herein, the "temperature at 10$^{2.5}$ poise" may be measured by a platinum sphere pull up method.

Sixteenth, the alkali-free glass of the present invention preferably has a viscosity at a liquidus temperature of 10$^{4.8}$ poise or more. Note that the "viscosity at a liquidus temperature" may be measured by a platinum sphere pull up method.

Seventeenth, the alkali-free glass of the present invention preferably has a thermal shrinkage ratio of less than 40 ppm when the temperature of the alkali-free glass is increased from a room temperature (25° C.) to 500° C. at a rate of 5° C./minute, is kept at 500° C. for 1 hour, and is then dropped to the room temperature at a rate of 5° C./minute. Herein, the "thermal shrinkage ratio" may be measured by such a method as mentioned below. As illustrated in FIG. 1A, a strip-shaped sample G3 with a size of 160 mm by 30 mm is first prepared as a sample for measurement. Markings M with waterproof abrasive paper #1000 are given on the strip-shaped sample G3 at each position at a distance of about 20 to 40 mm from the edge of each long side along the long side direction. After that, as illustrated in FIG. 1B, the strip-shaped sample G3 with the markings M is folded and separated into two pieces in the direction perpendicular to the marking direction, thereby yielding sample pieces G31 and G32. Then, as illustrated in FIG. 1C, one of the resultant sample pieces G31 and G32 is subjected to thermal treatment under a predetermined condition, the unheated sample and the heated sample are then lined up, the samples are fixed with, for example, tapes T while the lined-up state is kept, a laser microscope is used to read the position shift amounts of markings (Δ11 and Δ12), and the thermal shrinkage ratio is calculated on the basis of the following equation.

$$\text{Thermal shrinkage ratio [ppm]}=(\Delta 11\ [\mu m]+\Delta 12\ [\mu m])/160\times 10^{-3}$$

Eighteenth, the alkali-free glass of the present invention is preferably formed by an overflow down-draw method.

Nineteenth, the alkali-free glass of the present invention preferably has a thickness of less than 0.5 mm.

Twentieth, the alkali-free glass of the present invention is preferably used for an OLED device.

DESCRIPTION OF EMBODIMENTS

Figure 1A:
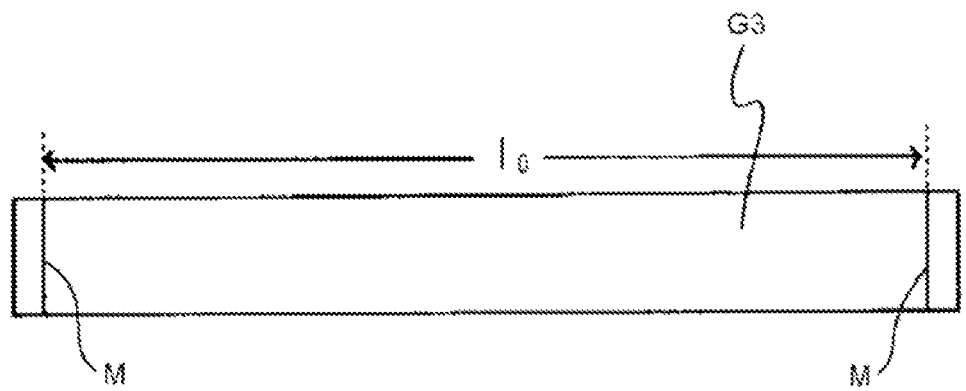
FIG. 1A is a view illustrating a measurement method for a thermal shrinkage ratio.
Figure 1B:
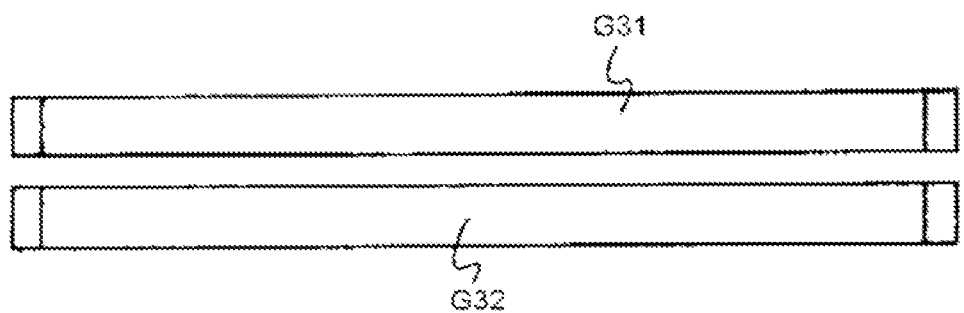
FIG. 1B is a view illustrating the measurement method for a thermal shrinkage ratio.
Figure 1C:
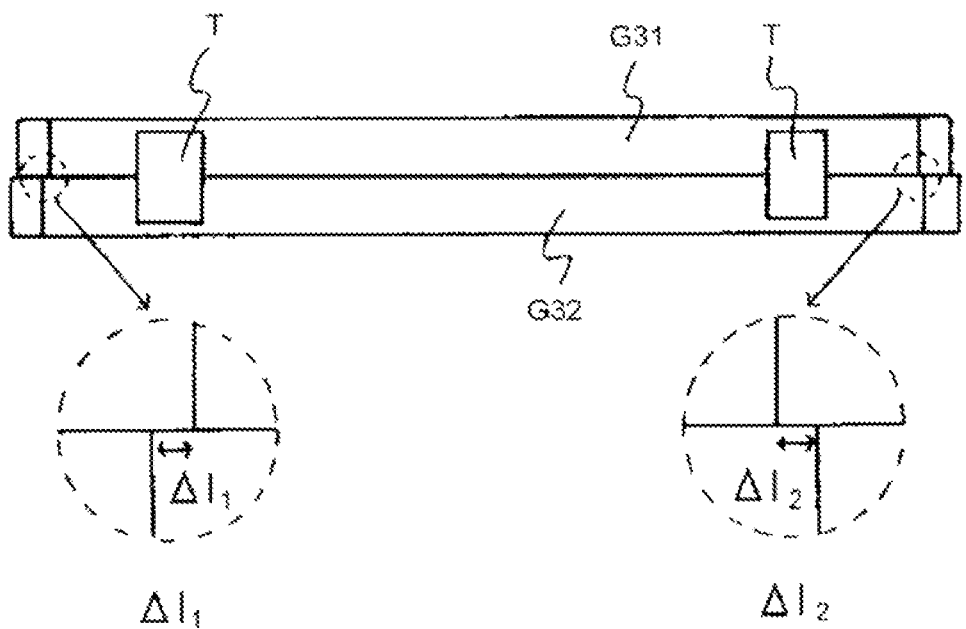
FIG. 1C is a view illustrating the measurement method for a thermal shrinkage ratio.

An alkali-free glass according to an embodiment of the present invention comprises as a glass composition, in terms of mol %, 60 to 70% of SiO$_2$, 9.5 to 17% of Al$_2$O$_3$, 0 to 9% of B$_2$O$_3$, 0 to 8% of MgO, 2 to 15% of CaO, 0.1 to 10% of SrO, and 0.5 to 4% of BaO, has a molar ratio (CaO+SrO+BaO)/Al$_2$CO$_3$ of 0.6 to 1.0, and is substantially free of alkali metal oxides. The reasons for limiting the content of each component as described above are described below. Note that the expression "%" refers to "mol %" in the following description of the content of each component unless otherwise stated.

$SiO_2$ is a component that forms the skeleton of glass. The content of $SiO_2$ is 60 to 70%, preferably 60 to 69%, more preferably 61 to 69%, still more preferably 62 to 69%, particularly preferably 62 to 68%. When the content of $SiO_2$ is too small, a density becomes too high and acid resistance becomes liable to lower. On the other hand, when the content of $SiO_2$ is too large, a viscosity becomes higher, meltability is liable to lower, devitrified crystals of cristobalite and the like are liable to precipitate, and a liquidus temperature becomes liable to increase.

$Al_2O_3$ is a component that forms the skeleton of glass, is a component that increases a strain point and the Young's modulus, and moreover, is a component that suppresses phase separation. The content of $Al_2O_3$ is 9.5 to 17%, preferably 9.5 to 16%, more preferably 9.5 to 15.5%, still more preferably 10 to 15%. When the content of $Al_2O_3$ is too small, the strain point and the Young's modulus are liable to lower, and the glass is liable to undergo phase separation. On the other hand, when the content of $Al_2O_3$ is too large, devitrified crystals such as mullite and anorthite are liable to precipitate, and the liquidus temperature is liable to increase.

$B_2O_3$ is a component that enhances the meltability and enhances devitrification resistance. The content of $B_2O_3$ is 0 to 9%, preferably 0 to 8.5%, more preferably 0 to 8%, still more preferably 0.5 to 8%, particularly preferably 1 to 8%. When the content of $B_2O_3$ is too small, the meltability and the devitrification resistance are liable to lower, and in addition, resistance to a hydrofluoric acid-based chemical liquid is liable to lower. On the other hand, when the content of $B_2O_3$ is too large, the Young's modulus and the strain point are liable to lower.

MgO is a component that lowers the viscosity and enhances the meltability, and is a component that remarkably increases the Young's modulus among alkaline-earth metal oxides. The content of MgO is 0 to 8%, preferably 0 to 7%, more preferably 0 to 6.7%, still more preferably 0 to 6.4%, particularly preferably 0 to 6%. When the content of MgO is too small, the meltability and the Young's modulus are liable to lower. On the other hand, when the content of MgO is too large, the devitrification resistance is liable to lower and the strain point is liable to lower.

CaO is a component that lowers the viscosity and remarkably enhances the meltability without lowering the strain point. CaO is also a component that contributes to reducing material cost, because a material for introducing the component is relatively inexpensive among alkaline-earth metal oxides. The content of CaO is 2 to 15%, preferably 2 to 14%, more preferably 2 to 13%, still more preferably 2 to 12%, particularly preferably 2 to 11%. When the content of CaO is too small, it becomes difficult to receive the benefit of the effects. On the other hand, when the content of CaO is too large, the glass is liable to devitrify and a thermal expansion coefficient is liable to increase.

SrO is a component that suppresses phase separation and enhances the devitrification resistance. SrO is also a component that lowers the viscosity and enhances the meltability without lowering the strain point, and moreover, is a component that suppresses the elevation of the liquidus temperature. The content of SrO is 0.1 to 10%, preferably 0.1 to 9%, more preferably 0.1 to 8%, still more preferably 0.1 to 7%, particularly preferably 0.1 to 6%. When the content of SrO is too small, it becomes difficult to receive the benefit of the effects. On the other hand, when the content of SrO is too large, strontium silicate-based devitrified crystals are liable to precipitate and the devitrification resistance is liable to lower.

BaO is a component that remarkably enhances the devitrification resistance. The content of BaO is 0.5 to 4%, preferably 0.6 to 4%, more preferably 0.7 to 4%, still more preferably 0.8 to 4%, particularly preferably 0.9 to 4%. When the content of BaO is too small, it becomes difficult to receive the benefit of the effects. On the other hand, when the content of BaO is too large, the density becomes too high, the meltability is liable to lower, devitrified crystals containing BaO are liable to precipitate, and the liquidus temperature is liable to increase.

The molar ratio $(CaO+SrO+BaO)/Al_2O_3$ is a component ratio which is important for striking a balance between a high specific Young's modulus and a high strain point and for enhancing the devitrification resistance. The molar ratio $(CaO+SrO+BaO)/Al_2O_3$ is 0.6 to 1.0, preferably 0.6 to 0.9, 0.6 to 0.89, 0.6 to 0.88, 0.6 to 0.87, 0.6 to 0.86, particularly preferably 0.6 to 0.85. When the molar ratio $(CaO+SrO+BaO)/Al_2O_3$ is too small, devitrified crystals of mullite and devitrified crystals attributed to alkaline-earth metals are liable to precipitate and the devitrification resistance lowers remarkably. On the other hand, when the molar ratio $(CaO+SrO+BaO)/Al_2O_3$ is larger, devitrified crystals of cristobalite and devitrified crystals of alkaline-earth aluminosilicate-based compounds such as anorthite are liable to precipitate, with the result that the devitrification resistance is liable to lower, and moreover, it is difficult to increase the specific Young's modulus and the strain point.

When a molar ratio $(SiO_2+MgO)/B_2O_3$ is restricted, the devitrification resistance is likely to be further increased. The molar ratio $(SiO_2+MgO)/B_2O_3$ is preferably 18.5 or less, 18.3 or less, 18.1 or less, 17.9 or less, 17.7 or less, particularly preferably 17.5 or less. Further, a molar ratio $MgO/SiO_2$ is also preferably restricted strictly. The molar ratio $MgO/SiO_2$ is preferably 0.1 or less, 0.09 or less, 0.08 or less, particularly preferably 0.07 or less. When the molar ratio $MgO/SiO_2$ is too large, the viscosity increases, the meltability is liable to lower, and devitrified crystals of cristobalite and the like are liable to precipitate.

In addition to the above-mentioned components, the following components, for example, may be added as arbitrary components. Note that the total content of the components except the above-mentioned components is preferably 10% or less, particularly preferably 5% or less, from the standpoint of surely receiving the benefit of the effects of the present invention.

ZnO is a component that enhances the meltability. However, when ZnO is comprised in a large amount, the glass is liable to devitrify and the strain point is liable to lower. The content of ZnO is preferably 0 to 5%, 0 to 4%, 0 to 3%, particularly preferably 0 to 2%.

$SnO_2$ is a component that has a good fining action in a high temperature range, is a component that increases the strain point, and is a component that lowers the viscosity. The content of $SnO_2$ is preferably 0.001 to 1%, 0.001 to 0.5%, 0.001 to 0.3%, particularly preferably 0.01 to 0.3%. When the content of $SnO_2$ is too large, a devitrified crystal of $SnO_2$ is liable to precipitate. Further, the precipitation of a devitrified crystal of $ZrO_2$ is liable to be promoted. Note that, when the content of $SnO_2$ is less than 0.001%, it becomes difficult to receive the benefit of the effects.

As described above, $SnO_2$ is suitable as a fining agent. In addition, it is possible to add, as a fining agent, F, Cl, $SO_3$, C, or metal powder of Al, Si, or the like up to 3%, as long as the characteristics of glass are not impaired. Besides, it is also possible to add, as a fining agent, $CeO_2$ or the like up to 3%.

$As_2O_3$ and $Sb_2O_3$ are also effective as fining agents. It is not completely excluded that the alkali-free glass of the present invention comprises those components, but it is preferred that those components be not used, from an environmental point of view. Further, when $As_2O_3$ is comprised in a large amount, solarization resistance tends to lower. The content of $As_2O_3$ is preferably 1% or less, 0.5% or less, particularly preferably 0.1% or less, and it is desirable that the glass be substantially free of $As_2O_3$. Further, the content of $Sb_2O_3$ is preferably 1% or less, particularly preferably 0.5% or less, and it is desirable that the glass be substantially free of $Sb_2O_3$.

Cl has an effect of promoting the melt of alkali-free glass, and hence, if Cl is added, a melting temperature can be made lower, the action of a fining agent is promoted, and consequently, it is possible to attain the longer life of a glass production furnace while melting cost is reduced. However, when the content of Cl is too large, the strain point is liable to lower, and hence the content of Cl is, in terms of mass %, preferably 3% or less, 1% or less, particularly preferably 0.5% or less. Note that it is possible to use, as a material for introducing Cl, a material such as a chloride of an alkaline-earth metal oxide, for example, strontium chloride, or aluminum chloride.

$P_2O_5$ is a component that increases the strain point and is a component that is capable of suppressing the precipitation of devitrified crystals of alkaline-earth aluminosilicate-based compounds such as anorthite. Note that, if $P_2O_5$ is comprised in a large amount, the glass is liable to undergo phase separation. The content of $P_2O_5$ is preferably 0 to 2.5%, 0 to 1.5%, 0 to 1%, particularly preferably 0 to 0.5%.

$TiO_2$ is a component that lowers the viscosity and enhances the meltability, and is a component that suppresses the solarization. However, if $TiO_2$ is comprised in a large amount, the glass is colored and the transmittance is liable to lower. The content of $TiO_2$ is preferably 0 to 4%, 0 to 3%, 0 to 2%, particularly preferably 0 to 0.1%.

$Y_2O_3$ and $Nb_2O_5$ have functions of increasing the strain point, the Young's modulus, and the like. However, if the content of each of those components is more than 2%, the density is liable to increase.

$La_2O_3$ also has functions of increasing the strain point, the Young's modulus, and the like. In recent years, prices of materials for introducing $La_2O_3$ have risen significantly. It is not completely excluded that the alkali-free glass of the present invention comprises $La_2O_3$, but it is preferred from the standpoint of batch cost that $La_2O_3$ be not added substantially. The content of $La_2O_3$ is preferably 2% or less, 1% or less, 0.5% or less, and it is desirable that the glass be substantially free of $La_2O_3$ (0.1% or less).

$ZrO_2$ has functions of increasing the strain point and the Young's modulus. However, when the content of $ZrO_2$ is too large, the devitrification resistance lowers remarkably. When $SnO_2$ is comprised, the content of $ZrO_2$ needs to be restricted particularly strictly. The content of $ZrO_2$ is preferably 0.2% or less, 0.15% or less, particularly preferably 0.1% or less.

The alkali-free glass according to this embodiment has a strain point of preferably more than 670° C., 675° C. or more, 680° C. or more, 685° C. or more, particularly preferably 690° C. or more. With such strain point, the thermal shrinkage a glass substrate is easily suppressed in an LTPS production process.

The alkali-free glass according to this embodiment has a Young's modulus of preferably more than 75 GPa, 75.5 GPa or more, 76 GPa or more, 76.5 GPa or more, particularly preferably 77 GPa or more. When the Young's modulus is too low, failures attributed to the deflection of a glass substrate, for example, failures such as a distorted image in the image plane of an electronic device are liable to occur.

The alkali-free glass according to this embodiment has a specific Young's modulus of preferably more than 30 GPa/g/cm$^3$, 30.2 GPa/g/cm$^3$ or more, 30.4 GPa/g/cm$^3$ or more, 30.6 GPa/g/cm$^3$ or more, particularly preferably 30.8 GPa/g/cm$^3$ or more. When the specific Young's modulus is too low, failures attributed to the deflection of a glass substrate, such as the breakage of the glass substrate during its transportation, are liable to occur.

The alkali-free glass according to this embodiment has a density of preferably less than 2.59 g/cm$^3$, less than 2.585 g/cm$^3$, less than 2.58 g/cm$^3$, less than 2.575 g/cm$^3$, particularly preferably less than 2.57 g/cm$^3$. When the density is too high, reduction in weight of a panel is difficult and it is difficult to increase the specific Young's modulus.

The alkali-free glass according to this embodiment has a liquidus temperature of preferably less than 1,210° C., 1,200° C. or less, 1,190° C. or less, 1,180° C. or less, 1,170° C. or less, 1,160° C. or less, particularly preferably 1,150° C. or less. With such liquidus temperature, it is easy to prevent a situation in which a devitrified crystal is generated at the time of producing glass, thus deteriorating the productivity. Besides, the glass can be easily formed into a glass substrate by an overflow down-draw method, and hence the surface quality of the glass substrate can be easily improved, and the production cost of the glass substrate can be reduced. Further, the significance of increasing devitrification resistance is very large also for the purpose of suppressing, to the maximum extent, the generation of devitrified products that can be surface defects, from the standpoints of a larger glass substrate and higher-definition display in recent years. Note that the liquidus temperature is an index of the devitrification resistance, and as the liquidus temperature of glass is lower, the glass is more excellent in devitrification resistance.

The alkali-free glass according to this embodiment has an average thermal expansion coefficient in the temperature range of 30 to 380° C. of preferably $30\times10^{-7}$ to $50\times10^{-7}$/° C., $32\times10^{-7}$ to $50\times10^{-7}$/° C., $32\times10^{-7}$ to $48\times10^{-7}$/° C., $32\times10^{-7}$ to $46\times10^{-7}$/° C., $32\times10^{-7}$ to $44\times10^{-7}$/° C., $3\times10^{-7}$ to $42\times10^{-7}$/° C., $33\times10^{-7}$ to $42\times10^{-7}$/° C., particularly preferably $33\times10^{-7}$ to $40\times10^{-7}$/° C. With such value, the average thermal expansion coefficient of the alkali-free glass can be easily matched with the thermal expansion coefficient of Si used in a TFT.

The alkali-free glass according to this embodiment has a temperature at $10^{4.0}$ poise of preferably 1,350° C. or less, 1,340° C. or less, 1,330° C. or less, 1,320° C. or less, 1,310° C. or less, particularly preferably 1,300° C. or less. When the temperature at $10^{4.0}$ poise is higher, the temperature at which the alkali-free glass is formed into a glass substrate is too high, with the result that the production cost of the glass substrate is liable to rise significantly.

The alkali-free glass according to this embodiment has a temperature at $10^{2.5}$ poise of preferably 1,620° C. or less, 1,610° C. or less, 1,600° C. or less, 1,590° C. or less, particularly preferably 1,580° C. or less. When the temperature at $10^{2.5}$ poise is higher, the glass is difficult to melt, with the results that the production cost of a glass substrate rises significantly and defects such as bubbles are liable to occur. Note that the temperature at $10^{2.5}$ poise corresponds to the melting temperature, and as this temperature is lower, the meltability improves.

The alkali-free glass according to this embodiment has a viscosity at a liquidus temperature of preferably $10^{4.8}$ poise or more, $1.0^{4.9}$ poise or more, $10^{5.0}$ poise or more, $10^{5.1}$ poise or more, $10^{5.2}$ poise or more, $10^{5.3}$ poise or more, particularly preferably $10^{5.4}$ poise or more. With such viscosity, the devitrification of the glass hardly occurs during shape formation, and hence, the glass can be easily formed into a glass substrate by an overflow down-draw method, with the result that the surface quality of the glass substrate can be enhanced, and the production cost of the glass substrate can be lowered. Note that the viscosity at the liquidus temperature is an index of formability, and as the viscosity at the liquidus temperature is higher, the formability is more improved.

The alkali-free glass according to this embodiment has a thermal shrinkage ratio of preferably less than 40 ppm, 35 ppm or less, 30 ppm or less, particularly preferably 25 ppm or less, when the temperature of the alkali-free glass is increased from a room temperature (25° C.) to 500° C. at a rate of 5° C./minute, is kept at 500° C. for 1 hour, and is then dropped to the room temperature at a rate of 5° C./minute. With such thermal shrinkage ratio, failures such as a pixel pitch shift do not easily occur even if thermal treatment is applied in an LTPS production process.

The alkali-free glass according to this embodiment is preferably formed by an overflow down-draw method. The overflow down-draw method refers to a method in which a molten glass is caused to overflow from both sides of a heat-resistant, trough-shaped structure, and the overflowing molten glasses are subjected to down-draw downward at the lower end of the trough-shaped structure while being joined, to thereby produce a glass substrate. When a glass substrate is produced by the overflow down-draw method, surfaces that are to serve as the surfaces of the glass substrate are formed in a state of free surfaces without being brought into contact with the trough-shaped refractory. As a result, it is possible to produce a glass substrate having a good surface quality without polishing at low cost and increase in size and reduction in thickness are easily achieved as well. Note that the structure and material of the trough-shaped structure that is used in the overflow down-draw method are not particularly limited as long as desired dimensions and surface accuracy can be realized. Further, a method of applying a force to glass at the time of performing down-draw downward is also not particularly limited. For example, there may be adopted a method involving rotating a heat-resistant roll having a sufficiently large width in a state of being in contact with glass, to thereby draw the glass, or a method involving allowing a plurality of pairs of heat-resistant rolls to come into contact with only the vicinities of end surfaces of glass, to thereby draw the glass.

It is also possible to form a glass substrate by, for example, a down-draw method (such as a slot down method or a redraw method), a float method, or the like, besides the overflow down-draw method.

The thickness of the alkali-free glass according to this embodiment is not particularly limited, and is preferably less than 0.5 mm, 0.4 mm or less, 0.35 mm or less, particularly preferably 0.3 mm or less. As the thickness is thinner, the weight of a device can be reduced accordingly. A glass substrate having a thinner thickness is more liable to deflect. However, because the alkali-free glass of the present invention has a high Young's modulus and a high specific Young's modulus, failures attributed to deflection do not easily occur. Note that the thickness can be adjusted by controlling, for example, the glass flow rate and the sheet-drawing speed at the time of producing a glass substrate.

When the β-OH value of the alkali-free glass of the present invention is reduced, the strain point can be increased. The β-OH value is preferably 0.5/mm or less, 0.45/mm or less, 0.4/mm or less, particularly preferably 0.35/mm or less. When the β-OH value is too large, the strain point is liable to lower. Note that, when the β-OH value is too small, the meltability is liable to lower. Thus, the β-OH value is preferably 0.01/mm or more, particularly preferably 0.05/mm or more.

The following methods are given as methods of reducing the β-OH value. (1) Materials having a low water content are selected, (2) components (such as Cl and $SO_3$) decreasing the water content in glass are added, (3) the water content in the atmosphere in a furnace is reduced, (4) $N_2$ bubbling is carried out in molten glass, (5) a small melting furnace is adopted, (6) the flow rate of molten glass is increased, and (7) an electric melting method is adopted.

Herein, the term "β-OH value" refers to a value obtained by measuring the transmittance of glass with an FT-IR and calculating by using the following equation.

$$\beta\text{-OH value} = (1/X)\log_{10}(T_1/T_2)$$

X: Glass thickness (mm)

$T_1$: Transmittance (%) at a reference wavelength of 3,846 $cm^{-1}$ $T_2$: Minimum transmittance (%) at a wavelength around a hydroxyl group absorption wavelength of 3,600 $cm^{-1}$ The alkali-free glass of the present invention is used preferably for an OLED device, particularly preferably for an OLED display. Although OLED displays are now generally commercially available, cost reduction thereof through mass production is strongly desired. The alkali-free glass of the present invention is excellent in productivity, rarely has a defect, and allows easy production of a large glass substrate, and hence the alkali-free glass can meet such demands properly.

EXAMPLES

Hereinafter, the present invention is described with reference to Examples. However, Examples below are merely examples, and the present invention is by no means limited thereto.

Tables 1 to 7 show Examples of the present invention (Sample Nos. 1 to 48) and Comparative Examples (Sample Nos. 49 to 52).

TABLE 1

| | | Example | | | | | | | |
|---|---|---|---|---|---|---|---|---|---|
| | | No. 1 | No. 2 | No. 3 | No. 4 | No. 5 | No. 6 | No. 7 | No. 8 |
| Glass composition (mol %) | $SiO_2$ | 66.4 | 67.1 | 68.0 | 66.4 | 65.8 | 66.0 | 66.1 | 65.7 |
| | $Al_2O_3$ | 13.5 | 13.5 | 12.8 | 12.8 | 12.8 | 12.9 | 12.9 | 12.5 |
| | $B_2O_3$ | 4.9 | 4.9 | 4.9 | 6.3 | 6.3 | 6.3 | 6.4 | 6.3 |
| | MgO | 5.5 | 4.7 | 4.7 | 4.7 | 4.7 | 4.7 | 4.7 | 4.7 |

TABLE 1-continued

|  |  | Example | | | | | | | |
|---|---|---|---|---|---|---|---|---|---|
|  |  | No. 1 | No. 2 | No. 3 | No. 4 | No. 5 | No. 6 | No. 7 | No. 8 |
|  | CaO | 6.3 | 6.3 | 6.3 | 6.3 | 6.9 | 6.3 | 6.3 | 7.5 |
|  | SrO | 0.7 | 0.7 | 0.7 | 0.7 | 0.7 | 1.0 | 0.7 | 0.7 |
|  | BaO | 2.7 | 2.7 | 2.7 | 2.7 | 2.7 | 2.7 | 2.9 | 2.6 |
|  | $SnO_2$ | 0.1 | 0.1 | 0.1 | 0.1 | 0.1 | 0.1 | 0.1 | 0.1 |
| Molar ratio (CaO + SrO + BaO)/$Al_2O_3$ | | 0.71 | 0.71 | 0.75 | 0.75 | 0.79 | 0.77 | 0.76 | 0.86 |
| Density [g/cm³] | | 2.554 | 2.545 | 2.537 | 2.532 | 2.539 | 2.541 | 2.542 | 2.543 |
| CTE [×$10^{-7}$/° C.] | | 36.8 | 36.4 | 36.3 | 36.7 | 37.6 | 37.4 | 37.2 | 38.5 |
| Young's modulus [GPa] | | 80.7 | 80.1 | 79.2 | 78.4 | 78.7 | 78.5 | 78.4 | 78.7 |
| Specific Young's modulus [GPa/g/cm³] | | 31.6 | 31.5 | 31.2 | 31.0 | 31.0 | 30.9 | 30.8 | 30.9 |
| Ps [° C.] | | 710 | 712 | 708 | 698 | 695 | 695 | 695 | 690 |
| Ta [° C.] | | 765 | 770 | 765 | 755 | 752 | 752 | 752 | 747 |
| Ts [° C.] | | 993 | 1,002 | 1,000 | 985 | 980 | 982 | 982 | 975 |
| $10^4$ dPa·s [° C.] | | 1,292 | 1,307 | 1,315 | 1,290 | 1,283 | 1,290 | 1,290 | 1,280 |
| $10^3$ dPa·s [° C.] | | 1,445 | 1,463 | 1,475 | 1,445 | 1,435 | 1,447 | 1,445 | 1,435 |
| $10^{2.5}$ dPa·s [° C.] | | 1,545 | 1,562 | 1,575 | 1,545 | 1,535 | 1,547 | 1,545 | 1,535 |
| TL [° C.] | | 1,160 | 1,195 | 1,155 | 1,110 | 1,120 | 1,115 | 1,095 | 1,135 |
| $Log_{10}\eta TL$ | | 5.3 | 5.0 | 5.5 | 5.8 | 5.6 | 5.7 | 5.9 | 5.4 |

TABLE 2

|  |  | Example | | | | | | | |
|---|---|---|---|---|---|---|---|---|---|
|  |  | No. 9 | No. 10 | No. 11 | No. 12 | No. 13 | No. 14 | No. 15 | No. 16 |
| Glass composition (mol %) | $SiO_2$ | 66.0 | 66.2 | 66.5 | 66.4 | 66.5 | 66.1 | 65.7 | 66.2 |
|  | $Al_2O_3$ | 12.5 | 12.6 | 12.6 | 13.2 | 12.8 | 13.2 | 13.6 | 12.8 |
|  | $B_2O_3$ | 6.3 | 6.4 | 6.4 | 6.3 | 6.3 | 6.4 | 6.4 | 6.3 |
|  | MgO | 4.7 | 4.7 | 4.8 | 4.7 | 4.7 | 4.7 | 4.7 | 4.7 |
|  | CaO | 6.3 | 6.3 | 5.1 | 6.3 | 6.3 | 6.3 | 6.3 | 6.9 |
|  | SrO | 1.3 | 0.7 | 1.3 | 0.3 | 0.3 | 0.3 | 0.3 | 0.3 |
|  | BaO | 2.7 | 3.1 | 3.1 | 2.7 | 2.9 | 2.9 | 2.9 | 2.6 |
|  | $SnO_2$ | 0.1 | 0.1 | 0.1 | 0.1 | 0.1 | 0.1 | 0.1 | 0.1 |
| Molar ratio (CaO + SrO + BaO)/$Al_2O_3$ | | 0.82 | 0.80 | 0.76 | 0.70 | 0.74 | 0.72 | 0.70 | 0.77 |
| Density [g/cm³] | | 2.546 | 2.548 | 2.552 | 2.526 | 2.533 | 2.537 | 2.539 | 2.530 |
| CTE [×$10^{-7}$/° C.] | | 37.8 | 37.9 | 37.4 | 36.1 | 36.6 | 36.8 | 36.6 | 37.0 |
| Young's modulus [GPa] | | 78.2 | 78.2 | 77.9 | 78.5 | 78.3 | 78.6 | 78.9 | 78.4 |
| Specific Young's modulus [GPa/g/cm³] | | 30.7 | 30.7 | 30.5 | 31.1 | 30.9 | 31.0 | 31.1 | 31.0 |
| Ps [° C.] | | 692 | 692 | 695 | 698 | 696 | 697 | 698 | 697 |
| Ta [° C.] | | 750 | 748 | 750 | 755 | 752 | 755 | 755 | 753 |
| Ts [° C.] | | 978 | 980 | 985 | 987 | 985 | 985 | 985 | 983 |
| $10^4$ dPa·s [° C.] | | 1,290 | 1,288 | 1,300 | 1,293 | 1,295 | 1,292 | 1,290 | 1,285 |
| $10^3$ dPa·s [° C.] | | 1,445 | 1,443 | 1,455 | 1,448 | 1,450 | 1,445 | 1,445 | 1,440 |
| $10^{2.5}$ dPa·s [° C.] | | 1,545 | 1,543 | 1,555 | 1,545 | 1,550 | 1,543 | 1,543 | 1,540 |
| TL [° C.] | | 1,125 | 1,105 | 1,100 | 1,180 | 1,130 | 1,160 | 1,195 | 1,125 |
| $Log_{10}\eta TL$ | | 5.6 | 5.8 | 5.9 | 5.1 | 5.6 | 5.2 | 4.9 | 5.6 |

TABLE 3

|  |  | Example | | | | | | | |
|---|---|---|---|---|---|---|---|---|---|
|  |  | No. 17 | No. 18 | No. 19 | No. 20 | No. 21 | No. 22 | No. 23 | No. 24 |
| Glass composition (mol %) | $SiO_2$ | 66.6 | 66.7 | 66.8 | 65.9 | 66.3 | 66.3 | 66.3 | 66.6 |
|  | $Al_2O_3$ | 13.2 | 12.9 | 13.2 | 12.4 | 12.9 | 13.1 | 12.8 | 12.9 |
|  | $B_2O_3$ | 6.3 | 6.4 | 6.4 | 6.3 | 6.1 | 5.9 | 6.3 | 6.3 |
|  | MgO | 3.9 | 3.9 | 3.9 | 5.5 | 4.7 | 4.7 | 4.7 | 4.7 |
|  | CaO | 6.9 | 6.9 | 6.3 | 6.8 | 6.9 | 6.9 | 6.6 | 5.7 |
|  | SrO | 0.3 | 0.3 | 0.3 | 0.3 | 0.3 | 0.3 | 0.5 | 1.0 |
|  | BaO | 2.7 | 2.9 | 2.9 | 2.6 | 2.7 | 2.7 | 2.7 | 2.7 |
|  | $SnO_2$ | 0.1 | 0.1 | 0.1 | 0.1 | 0.1 | 0.1 | 0.1 | 0.1 |

TABLE 3-continued

| | Example | | | | | | | |
|---|---|---|---|---|---|---|---|---|
| | No. 17 | No. 18 | No. 19 | No. 20 | No. 21 | No. 22 | No. 23 | No. 24 |
| Molar ratio (CaO + SrO + BaO)/$Al_2O_3$ | 0.75 | 0.79 | 0.72 | 0.79 | 0.76 | 0.75 | 0.76 | 0.73 |
| Density [g/cm$^3$] | 2.526 | 2.533 | 2.528 | 2.534 | 2.532 | 2.534 | 2.530 | 2.533 |
| CTE [×10$^{-7}$/° C.] | 36.1 | 37.2 | 36.2 | 37.6 | 37.0 | 37.0 | 37.0 | 36.6 |
| Young's modulus [GPa] | 78.1 | 77.6 | 78.0 | 78.8 | 78.5 | 79.1 | 78.5 | 78.1 |
| Specific Young's modulus [GPa/g/cm$^3$] | 30.9 | 30.7 | 30.9 | 31.1 | 31.0 | 31.2 | 31.0 | 30.8 |
| Ps [° C.] | 700 | 698 | 700 | 690 | 698 | 702 | 697 | 698 |
| Ta [° C.] | 758 | 755 | 760 | 747 | 755 | 758 | 755 | 755 |
| Ts [° C.] | 990 | 987 | 992 | 975 | 983 | 987 | 983 | 985 |
| 10$^4$ dPa · s [° C.] | 1,293 | 1,295 | 1,303 | 1,275 | 1,285 | 1,288 | 1,287 | 1,295 |
| 10$^3$ dPa · s [° C.] | 1,450 | 1,450 | 1,460 | 1,428 | 1,440 | 1,443 | 1,442 | 1,452 |
| 10$^{2.5}$ dPa · s [° C.] | 1,548 | 1,550 | 1,560 | 1,525 | 1,538 | 1,542 | 1,540 | 1,555 |
| TL [° C.] | 1,180 | 1,130 | 1,190 | 1,130 | 1,120 | 1,150 | 1,130 | 1,155 |
| Log$_{10}$ηTL | 5.0 | 5.6 | 5.0 | 5.4 | 5.6 | 5.3 | 5.5 | 5.3 |

TABLE 4

| | | Example | | | | | | | |
|---|---|---|---|---|---|---|---|---|---|
| | | No. 25 | No. 26 | No. 27 | No. 28 | No. 29 | No. 30 | No. 31 | No. 32 |
| Glass composition (mol %) | $SiO_2$ | 66.5 | 66.4 | 65.7 | 67.1 | 66.4 | 66.4 | 66.5 | 66.3 |
| | $Al_2O_3$ | 12.8 | 12.3 | 12.7 | 13.0 | 12.8 | 12.8 | 13.0 | 13.0 |
| | $B_2O_3$ | 6.3 | 7.2 | 7.3 | 5.4 | 6.3 | 6.3 | 6.3 | 6.3 |
| | MgO | 4.7 | 3.7 | 4.7 | 4.7 | 4.7 | 4.7 | 4.4 | 4.4 |
| | CaO | 6.3 | 7.1 | 6.2 | 6.4 | 6.5 | 6.4 | 6.5 | 6.8 |
| | SrO | 0.7 | 1.2 | 0.7 | 0.7 | 0.3 | 0.5 | 0.4 | 0.4 |
| | BaO | 2.7 | 2.0 | 2.6 | 2.7 | 2.8 | 2.7 | 2.7 | 2.7 |
| | $SnO_2$ | 0.1 | 0.1 | 0.1 | 0.1 | 0.1 | 0.1 | 0.1 | 0.1 |
| Molar ratio (CaO + SrO + BaO)/$Al_2O_3$ | | 0.75 | 0.84 | 0.74 | 0.75 | 0.75 | 0.75 | 0.74 | 0.76 |
| Density [g/cm$^3$] | | 2.530 | 2.512 | 2.522 | 2.540 | 2.531 | 2.531 | 2.529 | 2.533 |
| CTE [×10$^{-7}$/° C.] | | 36.8 | 37.2 | 36.7 | 36.9 | 36.8 | 36.8 | 36.6 | 37.0 |
| Young's modulus [GPa] | | 78.2 | 76.8 | 77.5 | 79.4 | 78.4 | 78.4 | 78.2 | 78.4 |
| Specific Young's modulus [GPa/g/cm$^3$] | | 30.9 | 30.6 | 30.7 | 31.2 | 31.0 | 31.0 | 30.9 | 31.0 |
| Ps [° C.] | | 695 | 688 | 690 | 703 | 698 | 697 | 700 | 698 |
| Ta [° C.] | | 750 | 745 | 745 | 760 | 755 | 755 | 755 | 755 |
| Ts [° C.] | | 982 | 975 | 975 | 992 | 985 | 985 | 987 | 985 |
| 10$^4$ dPa · s [° C.] | | 1,285 | 1,282 | 1,280 | 1,300 | 1,287 | 1,288 | 1,295 | 1,290 |
| 10$^3$ dPa · s [° C.] | | 1,442 | 1,437 | 1,438 | 1,455 | 1,443 | 1,442 | 1,455 | 1,445 |
| 10$^{2.5}$ dPa · s [° C.] | | 1,540 | 1,535 | 1,537 | 1,555 | 1,545 | 1,540 | 1,555 | 1,547 |
| TL [° C.] | | 1,120 | 1,110 | 1,115 | 1,140 | 1,115 | 1,125 | 1,160 | 1,140 |
| Log$_{10}$ηTL | | 5.6 | 5.7 | 5.6 | 5.5 | 5.7 | 5.6 | 5.2 | 5.4 |

TABLE 5

| | | Example | | | | | | | |
|---|---|---|---|---|---|---|---|---|---|
| | | No. 33 | No. 34 | No. 35 | No. 36 | No. 37 | No. 38 | No. 39 | No. 40 |
| Glass composition (mol %) | $SiO_2$ | 65.7 | 65.9 | 66.2 | 66.2 | 66.0 | 66.1 | 66.6 | 66.3 |
| | $Al_2O_3$ | 12.8 | 12.8 | 12.8 | 12.8 | 12.7 | 12.8 | 12.9 | 12.8 |
| | $B_2O_3$ | 6.3 | 6.3 | 6.3 | 6.3 | 6.3 | 6.3 | 6.3 | 5.8 |
| | MgO | 4.7 | 4.7 | 4.2 | 4.2 | 4.7 | 4.4 | 3.0 | 3.9 |
| | CaO | 7.5 | 6.9 | 7.6 | 7.6 | 7.6 | 7.6 | 8.1 | 8.1 |
| | SrO | 0.3 | 0.3 | 0.1 | 0.3 | 0.1 | 0.2 | 0.3 | 0.3 |
| | BaO | 2.6 | 2.9 | 2.6 | 2.5 | 2.5 | 2.6 | 2.7 | 2.7 |
| | $SnO_2$ | 0.1 | 0.1 | 0.1 | 0.1 | 0.1 | 0.1 | 0.1 | 0.1 |
| Molar ratio (CaO + SrO + BaO)/$Al_2O_3$ | | 0.82 | 0.79 | 0.81 | 0.82 | 0.80 | 0.81 | 0.86 | 0.86 |
| Density [g/cm$^3$] | | 2.537 | 2.540 | 2.528 | 2.528 | 2.527 | 2.528 | 2.530 | 2.540 |
| CTE [×10$^{-7}$/° C.] | | 38.0 | 37.6 | 37.1 | 37.4 | 37.3 | 37.4 | 37.7 | 38.2 |

TABLE 5-continued

| | Example | | | | | | | |
|---|---|---|---|---|---|---|---|---|
| | No. 33 | No. 34 | No. 35 | No. 36 | No. 37 | No. 38 | No. 39 | No. 40 |
| Young's modulus [GPa] | 78.8 | 78.6 | 78.1 | 78.4 | 78.8 | 78.4 | 77.7 | 78.8 |
| Specific Young's modulus [GPa/g/cm$^3$] | 31.1 | 31.0 | 30.9 | 31.0 | 31.2 | 31.0 | 30.7 | 31.0 |
| Ps [° C.] | 695 | 695 | 695 | 695 | 695 | 695 | 697 | 698 |
| Ta [° C.] | 750 | 750 | 752 | 750 | 750 | 750 | 755 | 755 |
| Ts [° C.] | 975 | 980 | 982 | 980 | 980 | 980 | 985 | 985 |
| 10$^4$ dPa · s [° C.] | 1,277 | 1,285 | 1,290 | 1,285 | 1,285 | 1,285 | 1,305 | 1,288 |
| 10$^3$ dPa · s [° C.] | 1,432 | 1,438 | 1,447 | 1,437 | 1,440 | 1,442 | 1,470 | 1,442 |
| 10$^{2.5}$ dPa · s [° C.] | 1,532 | 1,535 | 1,550 | 1,535 | 1,540 | 1,545 | 1,580 | 1,540 |
| TL [° C.] | 1,120 | 1,110 | 1,120 | 1,125 | 1,120 | 1,115 | 1,140 | 1,145 |
| Log$_{10}$ηTL | 5.5 | 5.7 | 5.6 | 5.5 | 5.6 | 5.7 | 5.5 | 5.4 |

TABLE 6

| | | Example | | | | | | | |
|---|---|---|---|---|---|---|---|---|---|
| | | No. 41 | No. 42 | No. 43 | No. 44 | No. 45 | No. 46 | No. 47 | No. 48 |
| Glass composition (mol %) | SiO$_2$ | 66.1 | 65.7 | 66.1 | 65.8 | 65.9 | 66.4 | 66.0 | 66.1 |
| | Al$_2$O$_3$ | 12.8 | 12.7 | 13.1 | 12.4 | 12.7 | 12.8 | 12.8 | 12.8 |
| | B$_2$O$_3$ | 6.3 | 6.3 | 6.3 | 6.3 | 6.3 | 6.3 | 6.3 | 6.3 |
| | MgO | 3.9 | 4.7 | 3.9 | 4.7 | 4.7 | 3.7 | 4.7 | 4.4 |
| | CaO | 8.1 | 8.0 | 8.1 | 8.0 | 7.6 | 7.6 | 7.6 | 7.6 |
| | SrO | 0.3 | 0.3 | 0.3 | 0.3 | 0.3 | 0.3 | 0.3 | 0.3 |
| | BaO | 2.4 | 2.2 | 2.2 | 2.4 | 2.4 | 2.7 | 2.5 | 2.5 |
| | SnO$_2$ | 0.1 | 0.1 | 0.1 | 0.1 | 0.1 | 0.1 | 0.1 | 0.1 |
| Molar ratio (CaO + SrO + BaO)/Al$_2$O$_3$ | | 0.85 | 0.83 | 0.81 | 0.87 | 0.81 | 0.83 | 0.82 | 0.81 |
| Density [g/cm$^3$] | | 2.528 | 2.525 | 2.521 | 2.533 | 2.527 | 2.528 | 2.530 | 2.528 |
| CTE [×10$^{-7}$/° C.] | | 38.1 | 37.9 | 37.4 | 38.6 | 37.7 | 37.5 | 38.1 | 37.8 |
| Young's modulus [GPa] | | 78.4 | 79.0 | 78.7 | 78.8 | 79.0 | 77.9 | 78.8 | 78.5 |
| Specific Young's modulus [GPa/g/cm$^3$] | | 31.0 | 31.3 | 31.2 | 31.1 | 31.3 | 30.8 | 31.1 | 31.1 |
| Ps [° C.] | | 695 | 695 | 697 | 690 | 695 | 693 | 695 | 695 |
| Ta [° C.] | | 750 | 750 | 753 | 745 | 750 | 750 | 750 | 750 |
| Ts [° C.] | | 980 | 977 | 980 | 972 | 980 | 983 | 978 | 980 |
| 10$^4$ dPa · s [° C.] | | 1,290 | 1,280 | 1,285 | 1,275 | 1,285 | 1,292 | 1,282 | 1,285 |
| 10$^3$ dPa · s [° C.] | | 1,447 | 1,435 | 1,448 | 1,427 | 1,440 | 1,450 | 1,438 | 1,442 |
| 10$^{2.5}$ dPa · s [° C.] | | 1,550 | 1,535 | 1,552 | 1,525 | 1,540 | 1,552 | 1,540 | 1,540 |
| TL [° C.] | | Not measured | Not measured | Not measured | Not measured | 1,120 | 1,130 | 1,130 | 1,130 |
| Log$_{10}$ηTL | | Not measured | Not measured | Not measured | Not measured | 5.6 | 5.6 | 5.4 | 5.5 |

TABLE 7

| | | Comparative Example | | | |
|---|---|---|---|---|---|
| | | No. 49 | No. 50 | No. 51 | No. 52 |
| Glass composition (mol %) | SiO$_2$ | 71.0 | 70.5 | 72.1 | 69.0 |
| | Al$_2$O$_3$ | 8.9 | 10.4 | 10.7 | 13.0 |
| | B$_2$O$_3$ | — | — | 2.0 | 4.8 |
| | MgO | — | — | — | 6.0 |
| | CaO | 17.9 | 16.0 | 10.4 | 4.6 |
| | SrO | — | — | 1.2 | 0.5 |
| | BaO | 2.1 | 3.1 | 3.6 | 2.0 |
| | SnO$_2$ | 0.1 | 0.1 | 0.1 | 0.1 |
| Molar ratio (CaO + SrO + BaO)/Al$_2$O$_3$ | | 2.25 | 1.83 | 1.40 | 0.55 |
| Density [g/cm$^3$] | | 2.605 | 2.629 | 2.596 | 2.499 |
| CTE [×10$^{-7}$/° C.] | | 47.7 | 47.2 | 42.5 | 33.1 |
| Young's modulus [GPa] | | 81.7 | 81.7 | 78.4 | 80.4 |
| Specific Young's modulus [GPa/g/cm$^3$] | | 31.4 | 31.1 | 30.2 | 32.2 |
| Ps [° C.] | | 740 | 745 | 725 | 720 |
| Ta [° C.] | | 790 | 798 | 785 | 777 |
| Ts [° C.] | | 1,000 | 1,013 | 1,025 | 1,013 |
| 10$^4$ dPa · s [° C.] | | 1,297 | 1,320 | 1,362 | 1,327 |

TABLE 7-continued

| | Comparative Example | | | |
|---|---|---|---|---|
| | No. 49 | No. 50 | No. 51 | No. 52 |
| 10$^3$ dPa · s [° C.] | 1,460 | 1,485 | 1,538 | 1,490 |
| 10$^{2.5}$ dPa · s [° C.] | 1,565 | 1,590 | 1,650 | 1,595 |
| TL [°C] | 1,315 | 1,230 | 1,230 | >1,250 |
| Log$_{10}$ηTL | 3.9 | 4.8 | 5.1 | — |

First, a glass batch prepared by blending glass materials so that each glass composition listed in the tables was attained was placed in a platinum crucible, and then melted at 1,600 to 1,650° C. for 24 hours. When the glass batch was dissolved, molten glass was stirred by using a platinum stirrer to homogenize it. Next, the molten glass was poured on a carbon sheet and formed into a sheet, followed by annealing for 30 minutes at a temperature close to the annealing temperature. Each of the resultant samples was evaluated for its density, average thermal expansion coefficient CTE in the temperature range of 30 to 380° C., Young's modulus, specific Young's modulus, strain point Ps, annealing temperature Ta, softening temperature Ts, temperature at a viscosity of $10^4$ dPa·s, temperature at a viscosity of $10^3$ dPa·s, temperature at a viscosity of $10^{2.5}$ dPa·s, liquidus temperature TL, and viscosity $\log_{10}\eta$TL at the liquidus temperature TL.

The density is a value obtained by measurement by the well-known Archimedes method.

The average thermal expansion coefficient CTE in the temperature range of 30 to 380° C. is a value measured with a dilatometer.

The term "Young's modulus" is a value obtained by measurement using a bending resonance method.

The strain point Ps, the annealing temperature Ta, and the softening temperature Ts are values obtained by measurement based on the method of ASTM C336.

The temperatures at viscosities of $10^4$ dPa·s, $10^3$ dPa·s, and $10^{2.5}$ dPa·s are values obtained by measurement by a platinum sphere pull up method.

The liquidus temperature TL is a value obtained by measuring a temperature at which crystals of glass are deposited after glass powder that passed through a standard 30-mesh sieve (500 μm) and remained on a 50-mesh sieve (300 μm) is placed in a platinum boat and then kept for 24 hours in a gradient heating furnace.

The viscosity $\log_{10}\eta$TL at the liquidus temperature is a value obtained by measuring the viscosity of glass at the liquidus temperature TL by a platinum sphere pull up method.

As evident from Tables 1 to 7, the glass composition of each of Sample Nos. 1 to 48 is restricted within the predetermined range, and hence Sample Nos. 1 to 43 each have a strain point of more than 670° C. and a specific Young's modulus of 30 GPa/g/cm³ or more. As a result, thermal shrinkage in an LTPS production process can be reduced, and hence it is determined that even at the time of producing a larger and thinner glass substrate using any of Sample Nos. 1 to 48, failures attributed to the deflection of the glass substrate do not easily occur. Further, Sample Nos. 1 to 48 each have a liquidus temperature of less than 1,210° C. and a temperature at $10^{2.5}$ dPa·s of less than 1,620° C., and hence Sample Nos. 1 to 48 each rarely have defects such as devitrified products and bubbles and are excellent in productivity. Therefore, it is determined that each of Sample Nos. 1 to 48 can be suitably used in a high-performance display such as an OLED display.

Figure 2:
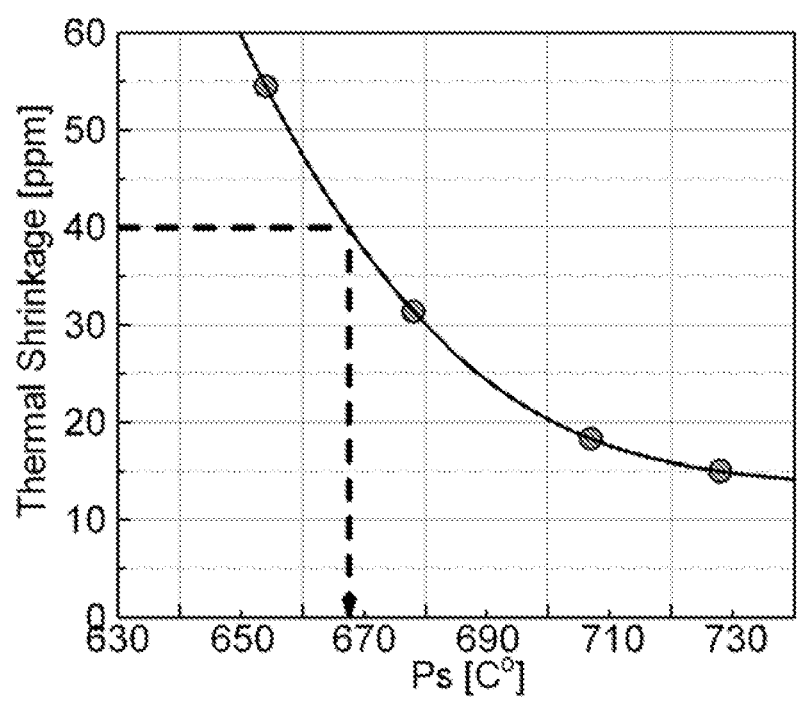
FIG. 2 is a data graph showing examination results on a relationship between a strain point and a thermal shrinkage ratio.

Next, FIG. 2 shows examination results on a relationship between a strain point and a thermal shrinkage ratio. It is found from FIG. 2 that as the strain point increases, the thermal shrinkage ratio decreases, and when the strain point is higher than 670° C., the thermal shrinkage ratio is lower than 40 ppm. Thus, each of Sample Nos. 1 to 48 has a strain point of more than 670° C., and hence it is determined that failures such as a pixel pitch shift do not easily occur even if thermal treatment is applied in an LTPS production process.

On the other hand, the glass composition of each of Sample Nos. 49 to 52 is not restricted within the predetermined range, and hence the liquidus temperature thereof is higher and the devitrification resistance thereof is lower. Thus, the formability thereof is inferior and minute foreign matter may cause the degradation of the quality and reliability of a display. Further, each of Sample Nos. 49 and 50 has a relatively high density, thus being difficult to be used for producing a panel with a reduced weight.

INDUSTRIAL APPLICABILITY

The alkali-free glass of the present invention is suitable for, for example, a substrate for an FPD such as an LCD or an OLED, a cover glass for an image sensor such as a charge coupled device (CCD) or a contact image sensor (CIS), a substrate and cover glass for a solar cell, and a substrate for an OLED lighting device, and in particular, is suitable as a substrate for an OLED.

The invention claimed is:

1. An alkali-free glass, comprising as a glass composition, in terms of mol %, 60 to 66.8% of $SiO_2$, 12.3 to 17% of $Al_2O_3$, 5.4 to 9% of $B_2O_3$, 0 to 6.4% of MgO, 5.7% to 15% of CaO, 0.1 to 10% of SrO, and 0.5 to 4% of BaO, having a molar ratio $(CaO+SrO+BaO)/Al_2O_3$ of 0.6 to 1.0, and being substantially free of alkali metal oxides,
wherein the alkali-free glass has an average thermal expansion coefficient in the temperature range of 30 to 380° C. of $361\times10^{-7}$ to $50\times10^{-7}$/° C.

2. The alkali-free glass according to claim 1, wherein the alkali-free glass has a molar ratio $(CaO+SrO+BaO)/Al_2O_3$ of 0.6 to 0.9.

3. The alkali-free glass according to claim 1, further comprising 0.001 to 0.3 mol % of $SnO_2$.

4. The alkali-free glass according to claim 1, wherein the alkali-free glass is substantially free of $As_2O_3$ and $Sb_2O_3$.

5. The alkali-free glass according to claim 1, wherein the alkali-free glass comprises less than 0.2 mol % of $ZrO_2$.

6. The alkali-free glass according to claim 1, wherein the alkali-free glass has a molar ratio $(SiO_2+MgO)/B_2O_3$ of less than 18.5.

7. The alkali-free glass according to claim 1, wherein the alkali-free glass has a strain point of more than 692° C.

8. The alkali-free glass according to claim 1, wherein the alkali-free glass has a Young's modulus of more than 75 GPa.

9. The alkali-free glass according to claim 1, wherein the alkali-free glass has a specific Young's modulus of more than 30 GPa/g/cm³.

10. The alkali-free glass according to claim 1, wherein the alkali-free glass has a density of less than 2.59 g/cm³.

11. The alkali-free glass according to claim 1, wherein the alkali-free glass has a liquidus temperature of less than 1,210° C.

12. The alkali-free glass according to claim 1, wherein the alkali-free glass has a temperature at $10^{4.0}$ poise of less than 1,350° C.

13. The alkali-free glass according to claim 1, wherein the alkali-free glass has a temperature at $10^{2.5}$ poise of less than 1,620° C.

14. The alkali-free glass according to claim 1, wherein the alkali-free glass has a viscosity at a liquidus temperature of $10^{4.8}$ poise or more.

15. The alkali-free glass according to claim 1, wherein the alkali-free glass has a thermal shrinkage ratio of less than 40 ppm when a temperature of the alkali-free glass is increased from a room temperature of 25° C. to 500° C. at a rate of 5° C./minute, is kept at 500° C. for 1 hour, and is then dropped to the room temperature at a rate of 5° C./minute.

16. The alkali-free glass according to claim 1, wherein the alkali-free glass is formed by an overflow down-draw method.

17. The alkali-free glass according to claim 1, wherein the alkali-free glass has a thickness of less than 0.5 mm.

18. The alkali-free glass according to claim 1, wherein the alkali-free glass is used for an OLED device.

* * * * *